United States Patent
Matsui et al.

(10) Patent No.: US 9,570,642 B2
(45) Date of Patent: Feb. 14, 2017

(54) SEALING MATERIAL SHEET FOR SOLAR CELL MODULES

(71) Applicant: Dai Nippon Printing Co., Ltd., Tokyo (JP)

(72) Inventors: Hideki Matsui, Tokyo (JP); Kosuke Saeki, Tokyo (JP); Yasushi Shirahige, Tokyo (JP); Noritoshi Akazawa, Tokyo (JP); Toshio Yoshihara, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 163 days.

(21) Appl. No.: 14/362,695

(22) PCT Filed: Dec. 3, 2012

(86) PCT No.: PCT/JP2012/081301
§ 371 (c)(1),
(2) Date: Jun. 4, 2014

(87) PCT Pub. No.: WO2013/084850
PCT Pub. Date: Jun. 13, 2013

(65) Prior Publication Data
US 2014/0311557 A1 Oct. 23, 2014

(30) Foreign Application Priority Data
Dec. 5, 2011 (JP) ................. 2011-266018

(51) Int. Cl.
*H01L 31/04* (2014.01)
*C09D 123/08* (2006.01)
*H01L 31/048* (2014.01)

(52) U.S. Cl.
CPC ..... *H01L 31/0481* (2013.01); *C09D 123/0815* (2013.01); *C08L 2203/204* (2013.01); *C08L 2205/025* (2013.01); *C08L 2207/06* (2013.01); *C08L 2312/08* (2013.01); *C08L 2314/06* (2013.01); *Y02E 10/50* (2013.01)

(58) Field of Classification Search
CPC . H01L 31/0481; C09D 123/04; C09D 123/06; C08L 2203/204; C08L 2205/0025; C08L 2207/66; Y02E 10/50
See application file for complete search history.

(56) References Cited

U.S. PATENT DOCUMENTS

| | | |
|---|---|---|
| 2006/0142490 A1 | 6/2006 | Oi |
| 2011/0045287 A1 | 2/2011 | Kawashima et al. |
| 2012/0073631 A1 | 3/2012 | Ikenaga et al. |
| 2013/0174907 A1* | 7/2013 | Murasawa ............ B32B 27/327 136/259 |
| 2013/0247987 A1 | 9/2013 | Taniguchi et al. |

FOREIGN PATENT DOCUMENTS

| | | | |
|---|---|---|---|
| CN | 101981096 A | 2/2011 | |
| EP | 2270077 A1 | 1/2011 | |
| EP | 2439239 A1 | 4/2012 | |
| EP | 2648227 A1 | 10/2013 | |
| JP | 2005-019975 A | 1/2005 | |
| JP | 2009-010277 A | 1/2009 | |
| JP | 2009-249556 A | 10/2009 | |
| JP | 2011-012243 A | 1/2011 | |
| JP | 2011-077357 A | 4/2011 | |
| JP | 2011074263 A | 4/2011 | |
| JP | 2011-181637 A | 9/2011 | |
| JP | 2011-210798 A | 10/2011 | |
| JP | WO 2011152314 A1 * | 12/2011 | ........... B32B 27/327 |
| JP | 2012-094845 A | 5/2012 | |
| WO | WO-2010/140343 A1 | 12/2010 | |
| WO | WO-2012073971 A1 | 6/2012 | |

OTHER PUBLICATIONS

Extended European Search Report dated Jul. 31, 2015 in European Application No. 12855133.0.
Office Action issued for corresponding Korean Patent Application No. KR 10-2014-7015275, dated Nov. 30, 2015.
Chinese Office Action dated Jul. 24, 2015 in Chinese Application No. 201280059689.4.
International Search Report of PCT/JP2012/081301 dated Jan. 15, 2013.

* cited by examiner

*Primary Examiner* — Sanza McClendon
(74) *Attorney, Agent, or Firm* — Locke Lord LLP; James E. Armstrong, IV; Nicholas J. DiCeglie, Jr.

(57) ABSTRACT

Provided is a sealing material sheet for solar cell modules, which is obtained by irradiating a polyethylene resin with ionizing radiation and has high transparency, heat resistance and adhesion at the same time. This sealing material sheet for solar cell modules contains a low density polyethylene having a density of 0.900 g/cm$^3$ or less, while having a gel fraction of from 0% to 40% (inclusive) and a degree of dispersity (Mw/Mn), which is the ratio of the weight average molecular weight (Mw) to the number average molecular weight (Mn) in terms of polystyrene, of from 2.5 to 3.5 (inclusive).

20 Claims, 2 Drawing Sheets

SEALING MATERIAL SHEET FOR SOLAR CELL MODULES

CROSS-REFERENCE TO RELATED APPLICATIONS

This application is the national phase under 35 U.S.C. §371 of PCT International Application No. PCT/JP2012/081301, filed Dec. 3, 2012, which claims the benefit of Japanese Patent Application No. 2011-266018, filed Dec. 5, 2011, the entire contents of the aforementioned applications are hereby incorporated herein by reference.

TECHNICAL FIELD

The present invention relates to a polyethylene-based sealing material sheet for a solar cell module. More specifically, the present invention relates to a sealing material sheet for a solar cell module in which a cross-linking treatment with ionizing radiation such as an electron beam is performed.

BACKGROUND ART

Conventionally, a combination of an ethylene-vinyl acetate copolymer resin (EVA) and a cross-linking agent represented by an organic peroxide has been frequently used as a sealing material sheet for a solar cell module. Further, in recent years, a sealing material sheet using a polyethylene-based resin has also become widely used instead of the EVA by taking advantage of the excellent water vapor barrier properties.

As a polyethylene-based sealing material sheet, for example, it has been also known from a sealing material by a modified ethylenic resin containing alkoxysilane as a copolymerization component. Furthermore, it has been known of a sealing material sheet in which such a modified ethylenic resin is mixed with a cross-linking agent, and the mixture is cross-linked by a modularization step or the subsequent heating step (see Patent Document 1).

On the other hand, in addition to a thermal cross-linking treatment method in which an organic peroxide is heated, a technique for improving the heat resistance of a sealing material sheet by performing a cross-linking treatment by irradiation with ionizing radiation onto the polyethylene-based resin and the like, without the use of a cross-linking agent has been disclosed as a method of cross-linking treatment (see Patent Document 2). Furthermore, a technique for imparting heat resistance by performing a cross-linking treatment by irradiation with ionizing radiation onto the linear low density polyethylene having a predetermined density or less, and by eliminating a heat curing step for a long time also without the use of a cross-linking agent has been disclosed (see Patent Document 3).

[Patent Document 1] Japanese Unexamined Patent Application, Publication No. 2009-10277
[Patent Document 2] Japanese Unexamined Patent Application, Publication No. 2009-249556
[Patent Document 3] Japanese Unexamined Patent Application, Publication No. 2011-77357

DISCLOSURE OF THE INVENTION

Problems to be Solved by the Invention

However, as in the sealing material sheet described in Patent Document 1, a sealing material sheet obtained by performing a thermal cross-linking treatment on a polyethylene-based resin has also room left for further improvement in heat resistance.

Furthermore, as in the sealing material sheet described in Patent Document 2 or 3, a sealing material sheet obtained by irradiation with ionizing radiation onto a polyethylene-based resin has room left for improvement in the point that there is a disadvantage that the transparency is inferior as compared to that in the case where a conventional thermal cross-linking treatment is performed although released from the constraints of the modularization condition described above, and expecting improvement in the heat resistance by a cross-linking treatment. Furthermore, there is also a problem that when the irradiation intensity of ionizing radiation is increased in order to obtain sufficient heat resistance, the adhesion is decreased.

The present invention has been made in order to solve the problem described above. An object of the present invention is to provide a sealing material sheet for a solar cell module that has high transparency, heat resistance and adhesion.

Means for Solving the Problems

The present inventors found that a polyethylene-based sealing material sheet excellent in terms of transparency, heat resistance, and adhesion can be obtained by performing a cross-linking treatment by irradiation with ionizing radiation in advance before the modularization after the formation of a sealing material sheet by extrusion, and then by optimizing the gel fraction, and the distribution of molecular weight, that is, the degree of dispersity (Mw/Mn) (hereinafter, also simply referred to as "dispersity") that is the ratio of the weight average molecular weight (Mw) to the number average molecular weight (Mn) in the predetermined range, and thus have completed the present invention. More specifically, the present invention provides the following.

(1) A sealing material sheet for a solar cell module, containing a low density polyethylene having a density of 0.900 g/cm$^3$ or less, wherein a gel fraction is 0% or more to 40% or less, and a degree of dispersity (Mw/Mn) being a ratio of weight average molecular weight (Mw) to number average molecular weight (Mn) in terms of polystyrene is 2.5 or more to 3.5 or less.

(2) The sealing material sheet for a solar cell module according to (1), wherein the number average molecular weight is 80000 g/mol or more to 120000 g/mol or less, and the weight average molecular weight is 220000 g/mol or more to 300000 g/mol or less.

(3) The sealing material sheet for a solar cell module according to (1) or (2), wherein the gel fraction is 0% or more to less than 10%.

(4) The sealing material sheet for a solar cell module according to any one of (1) to (3), wherein the gel fraction is 0% or more to less than 1%.

(5) The sealing material sheet for a solar cell module according to any one of (1) to (4), wherein a complex viscosity at 150° C. is 85000 Pa·S or more to 180000 Pa·S or less.

(6) The sealing material sheet for a solar cell module according to any one of (1) to (5), wherein a haze value at a thickness of 400 μm is 4% or less.

(7) A solar cell module, containing the sealing material sheet according to any one of (1) to (6).

(8) A method for producing the sealing material sheet for a solar cell module according to any one of (1) to (6), wherein a sealing material composition containing a low density polyethylene having a density of 0.900 g/cm$^3$ or less, and a cross-linking agent in an amount of 0.01 percent by mass or more to less than 0.5 percent by mass in the composition is melt formed, and then irradiation with ionizing radiation onto the sealing material composition is performed.

(9) The method for producing the sealing material sheet for a solar cell module according to (8), wherein a difference determined by subtracting a degree of dispersity obtained before the irradiation with ionizing radiation from a degree of dispersity obtained after the irradiation with ionizing radiation is +0.3 or more to +1.0 or less.

(10) The method for producing the sealing material sheet for a solar cell module according to (9), wherein the number average molecular weight before the irradiation with ionizing radiation is 80000 g/mol or more to 120000 g/mol or less, and the weight average molecular weight before the irradiation with ionizing radiation is 150000 g/mol or more to 250000 g/mol or less.

Effects of the Invention

According to the present invention, a polyethylene-based sealing material sheet for a solar cell module which is excellent in terms of transparency, heat resistance, and adhesion to other members in a solar cell module can be provided.

EXPLANATION OF REFERENCE NUMERALS

Figure 1:
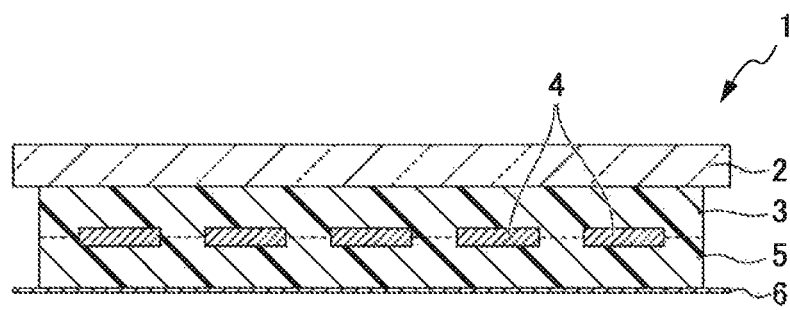
FIG. 1 is a sectional view illustrating one example of the layer structures of a solar cell module using a sealing material sheet of the present invention.

1. Solar cell module
2. Transparent front substrate
3. Front surface sealing material layer
4. Solar cell element
5. Rear surface sealing material layer
6. Rear surface protective sheet

PREFERRED MODE FOR CARRYING OUT THE INVENTION

The sealing material sheet for a solar cell module of the present invention (hereinafter, also simply referred to as a "sealing material sheet") is characterized by being provided with extremely preferable heat resistance, transparency, and adhesion to other members in a solar cell module as a sealing material sheet for a solar cell module by the limitation of the gel fraction and the degree of dispersity to the predetermined range described above.

A sealing material composition for a solar cell module (hereinafter, also simply referred to as a "sealing material composition") to produce a sealing material sheet of the present invention contains a low density polyethylene having a density of 0.900 g/cm$^3$ or less, a cross-linking agent, and a cross-linking auxiliary agent as the essential components. Hereinafter, the essential components will be explained, and then other resins and other components will be explained. Sealing material composition
[Low Density Polyethylene]

In the present invention, a low density polyethylene (LDPE) having a density of 0.900 g/cm$^3$ or less is used, and preferably a linear low density polyethylene (LLDPE) is used. The linear low density polyethylene is a copolymer of ethylene and α-olefin, and in the present invention, the density is in the range of 0.900 g/cm$^3$ or less, preferably in the range of 0.890 g/cm$^3$ or less, and more preferably in the range of 0.870 to 0.885 g/cm$^3$. With this range, while sheet workability is maintained, favorable flexibility and transparency can be imparted.

In the present invention, it is preferable to use metallocene-based linear low density polyethylene. The metallocene-based linear low density polyethylene is synthesized with the use of a metallocene-based catalyst that is a single-site catalyst. In such polyethylene, the branches of the side chain are less, and the distribution of comonomer is uniform. Therefore, the molecular weight distribution is narrow, such above-mentioned ultralow-density can be achieved, and thus flexibility can be imparted to a sealing material. With flexibility being imparted, the adhesion of a sealing material and another member such as a transparent front substrate is enhanced.

Furthermore, the crystalline distribution is narrow and the crystal size is uniform, therefore, not only there are no crystals with a large crystal, size, but also the crystallinity itself is low because of the low density. Therefore, transparency when processed into a sheet shape is excellent. Therefore, even if a sealing material made of the sealing material composition of the present invention is disposed between a transparent front substrate and a solar cell element, the power generation efficiency is hardly decreased.

An α-olefin having no branch is preferably used as an α-olefin of linear low density polyethylene, and among them, 1-hexene, 1-heptene, or 1-octene, which is an α-olefin having 6 to 8 carbon atoms, is particularly preferably used. In the case where the number of carbon atoms of α-olefin is 6 or more to 8 or less, the flexibility that is favorable for a sealing material sheet can be imparted, and also favorable strength can be imparted. As a result, the adhesion of a sealing material sheet and another member is further enhanced.

As to the melt mass flow rate (MFR) of the low density polyethylene, the MFR measured at 190° C. under a load of 2.16 kg in accordance with JIS-K6922-2 (hereinafter, in the present specification, the measured value under the measurement conditions Is referred to as MFR) is preferably 0.5 g/10 min or more to 40 g/10 min or less, and more preferably 6 g/10 min or more to 40 g/10 min or less.

The sealing material sheet of the present invention is a cross-linked sealing material sheet obtained by performing a cross-linking treatment by the irradiation with ionizing radiation onto the sealing material composition after the melt formation. Therefore, even if the MFR of the low density polyethylene that is to be the base is high, the flowability during the modularization can be suppressed by a cross-linking treatment after the film formation. Therefore, even if the MFR is as high as the range described above, the low density polyethylene can be suitably used.

As to the molecular weight of the low density polyethylene itself that is a raw material, in the case of the metallocene-based linear low density polyethylene described above, the number average molecular weight (Mn) is around 30000 to 40000 g/mol and the weight average molecular weight (Mw) is around 70000 to 90000 g/mol in terms of polystyrene, and the degree of dispersity (Mw/Mn) is around 2.2 to 2.4. The molecular weight and molecular weight distribution are changed according to the cross-linking agent and irradiation with ionizing radiation described below.

Furthermore, a silane-modified polyethylene-based resin may be contained in the sealing material composition of the present invention. A silane-modified polyethylene-based resin is obtained by the graft polymerization of an ethylenic unsaturated silane compound as the side chain to linear low density polyethylene (LLDPE) or the like, which is to be the main chain. Such a graft copolymer has a higher degree of freedom of a silanol group, which contributes to the adhesion, therefore, the adhesive properties of the sealing material sheet to other members in a solar cell module can be improved.

A silane-modified polyethylene-based resin can be produced by, for example, a method described in Japanese Unexamined Patent Application, Publication No. 2003-46105. With the use of the resin as the component of a sealing material composition of a solar cell module, a solar cell module that is excellent in terms of strength, durability, weather resistance, heat resistance, water resistance, light resistance, wind pressure resistance, hail resistance, and other properties, and also extremely excellent in terms of thermal fusability without being affected by the production conditions such as heat and pressure, under which a solar cell module is produced, and is obtained stably at a low cost and is suitable for various applications.

As the ethylenic unsaturated silane compound that is graft polymerized with linear low density polyethylene, for example, one or more kinds selected from vinyltrimethoxysilane, vinyltriethoxysilane, vinyltripropoxysilane, vinyltriisopropoxysilane, vinyltributoxysilane, vinyltripentyloxysilane, vinyltriphenoxysilane, vinyltribenzyloxysilane, vinyltrimethylenedioxysilane, vinyltriethylenedioxysilane, vinylpropionyloxysilane, vinyltriacetoxysilane, and vinyltricarboxysilane can be used.

The grafted amount that is a content of an ethylenic unsaturated silane compound may be appropriately adjusted so as to be, for example, 0.001 or more to 15 or less parts by mass, preferably 0.01 or more to 5 or less parts by mass, particularly preferably 0.05 or more to 2 or less parts by mass, relative to 100 parts by mass of the total resin components in the sealing material composition containing other polyethylene-based resins, which is described below. In the present invention, in the case where the content of an ethylenic unsaturated silane compound is large, mechanical strength, heat resistance, and the like are excellent, however, in the case where the content is excessive, tensile elongation, thermal fusability, and the like tend to be inferior.

Further, an acid-modified polyethylene-based resin represented by a maleic anhydride-modified polyethylene-based resin may be contained in the sealing material composition. An acid-modified polyethylene-based resin is, for example, obtained by the graft polymerization of maleic anhydride or the like as the side chain to linear low density polyethylene (LLDPE) or the like, which is to be the main chain. Such a graft polymer has a higher degree of polarity in the part of the acid that contributes to the adhesion, therefore, adhesive properties of the sealing material sheet to a metal member in a solar cell module can be improved.

The content of low density polyethylene contained in the sealing material composition is preferably 10 or more to 99 or less parts by mass, more preferably 50 or more to 99 or less parts by mass, and further more preferably 90 or more to 99 or less parts by mass, relative to 100 parts by mass of the total resin components in the sealing material composition. As long as the melting point of the sealing material composition is maintained in the range of less than 80° C., other resins may be contained in it. These may be used as, for example, an additive resin, and the other components described below may be used for a master batch.

[Cross-Linking Agent]

The cross-linking agent is not particularly limited, and a known agent, for example, a known radical polymerization initiator can be used as the cross-linking agent. Examples of the radical polymerization initiator include, for example, a hydroperoxide such as diisopropylbenzene hydroperoxide, and 2,5-dimethyl-2,5-di(hydroperoxcy)hexane; a dialkyl peroxide such as di-t-butyl peroxide, t-butyl cumyl peroxide, dicumyl peroxide, 2,5-dimethyl-2,5-di(t-butyl peroxy) hexane, and 2,5-dimethyl-2,5-di(t-peroxy)hexyne-3; a diacyl peroxide such as bis-3,5,5-trimethylhexanoyl peroxide, octanoyl peroxide, benzoyl peroxide, o-methyl benzoyl peroxide, and 2,4-dichlorobenzoyl peroxide; a peroxy ester such as t-butyl peroxyacetate, t-butyl peroxy-2-ethylhexanoate, t-butyl peroxypivalate, t-butyl peroxyoctoate, L-butyl peroxy isopropylcarbonate, t-butyl peroxybenzoate, di-t-butyl peroxyphthalate, 2,5-dimethyl-2,5-di(benzoylperoxy) hexane, 2,5-dimethyl-2,5-di(benzoylperoxy)hexyne-3, and t-butyl peroxy-2-ethyl hexyl carbonate; an organic peroxide of a ketone peroxide such as methyl ethyl ketone peroxide, and cyclohexanone peroxide, and the like; an azo compound such as azobisisobutyronitrile, and azobis(2,4-dimethylvaleronitrile); a silanol condensation catalyst such as dibutyltin diacetate, dibutyltin dilaurate, dibutyltin dioctoate, dioctyltin dilaurate, and dicumyl peroxide; and the like.

Conventionally, in the case where a cross-linking treatment by irradiation with ionizing radiation is performed, it has been considered that a cross-linking agent such as an organic peroxide is not necessary, which is different from the case of a thermal cross-linking treatment. However, the sealing material composition used in the present invention contains a small amount of cross-linking agent, although performing a cross-linking treatment by irradiation with ionizing radiation. By the addition of the cross-linking agent, the heat resistance is improved by irradiation with ionizing radiation, and further the transparency can be maintained. The action of crosslinking agent in the cross-linking treatment by irradiation with ionizing radiation is not clear, however, it is presumed that although the cross-linking proceeds because the ionizing radiation has strong energy, crystals causing haze are not loosened until the temperature is increased to a certain degree or more, and remain without being involved in the cross-linking.

The addition amount of cross-linking agent to the sealing material composition of the present invention is preferably 0.01 or more to 1.5 or less parts by mass, more preferably 0.3 or more to 0.7 or less part by mass, and further more preferably 0.3 or more to 0.5 or less part by mass, relative to 100 parts by mass of the total components in the sealing material composition. By the setting of the addition amount of cross-linking agent in the sealing material composition in this range, a sealing material sheet that is excellent also in terms of transparency in addition to heat resistance and adhesion can be obtained. In this case, in the case where the content of cross-linking agent is less than 0.01 part by mass, the effect of transparency improvement is insufficient, and in the case where the content exceeds 0.7 part by mass, the load at extrusion becomes higher, gel may be generated during the forming, and the like, and thus the film formability is decreased and the transparency is also decreased. In addition, the sealing material sheet of the present invention can be obtained by performing a cross-linking treatment by irradiation with ionizing radiation. In this case, even in the case where the addition amount of the cross-linking material is less than 0.5 part by mass, sufficient heat resistance can be obtained, which is different from the case of a conventional thermal cross-linking treatment. According to this, the risk of productivity reduction by the gelation of the sealing material composition in the sheeting step of the sealing material composition can be decreased, and also the production cost can be reduced by the reduction of the amount of cross-linking agent used.

In addition, a cross-linking treatment is required for a conventional uncross-linked sealing material sheet in the step of modularization. Therefore, the half-life temperature of the cross-linking agent used for a cross-linking treatment in an uncross-linked sealing material sheet is restricted by the conditions of heating temperature and heating time in the modularization step, and thus has been actually limited to a one-minute half-life temperature of around less than 185° C. However, in the case where the cross-linked sealing material sheet of the present invention is produced, the cross-linking agent can be selected without receiving the restriction described above. Generally, the upper limit temperature of the cross-linking agent is around 230° C. from the viewpoint of the oxidative degradation of resin, however, in the production of the cross-linked sealing material sheet of the present invention, as long as the temperature is in the range of the upper limit temperature or lower, a cross-linking agent having a one-minute half-life temperature of 185° C. or higher can also be freely selected. Furthermore, by the expansion of the selection range as described above, the temperature at which the sealing material sheet is uncross-linked and formable increases, and thus the advantage that the productivity is improved is obtained.

[Cross-Linking Auxiliary Agent]

In the present invention, a polyfunctional monomer having a carbon-carbon double bond and/or an epoxy group may be used as a cross-linking auxiliary agent. More preferably, an allyl group, a (meth)acrylate group, or a vinyl group is used as the functional group of the polyfunctional monomer. According to this, moderate cross-linking reaction is promoted, and also in the present invention, the cross-linking auxiliary agent lowers the crystallinity of the low density polyethylene, and maintains the transparency.

Specifically, examples of the cross-linking auxiliary agent include a polyallyl compound such as triallyl isocyanurate (TAIC), triallyl cyanurate, diallyl phthalate, diallyl fumarate, and diallyl maleate; a poly(meth)acryloyloxy compound such as trimethylolpropane trimethacrylate (TMPT), trimethylolpropane triacrylate (TMPTA), ethylene glycol diacrylate, ethylene glycol dimethacrylate, 1,4-butanediol diacrylate, 1,6-hexanediol diacrylate, and 1,9-nonanediol diacrylate; and an epoxy-based compound such as glycidyl methacrylate containing a double bond and an epoxy group, 4-hydroxybutyl acrylate glycidyl ether and 1,6-hexanediol diglycidyl ether having 2 or more epoxy groups, 1,4-butanediol diglycidyl ether, cyclohexanedimethanol diglycidyl ether, and trimethylolpropane polyglycidyl ether. These may be used alone or two or more kinds in combination.

Among the above, TAIC can be preferably used from the viewpoint that the compatibility with the low density polyethylene is favorable, the crystallinity is lowered by the cross-linking and transparency is maintained, and flexibility is imparted at a low temperature. Furthermore, from the viewpoint of the reactivity with a silane coupling agent, 1,6-hexanediol diacrylate can also be preferably used.

The content of the cross-linking auxiliary agent is in the range of preferably 0.01 or more to 3 or less parts by mass, and more preferably 0.05 or more to 2.0 or less parts by mass, relative to 100 parts by mass of the total components in the sealing material composition. As long as the content is in this range, the appropriate cross-linking reaction by irradiation with ionizing radiation is promoted, and the gel fraction of cross-linked sealing material sheet before the modularization can be 40% or less.

[Adhesion Improver]

In the production method of the present invention, in which a cross-linking treatment by irradiation with ionizing radiation is performed, the adhesion improver described above is preferably added to the sealing material composition. In this respect, when the sealing material composition is irradiated with a large dose of ionizing radiation, the expansion rate can be suppressed, on the other hand, there is a case where an adhesive component on the surface of the sealing material sheet is damaged, and the adhesion is decreased. However, it is presumed that the adhesion can be secured because of the exudation effect of a silane coupling agent with a low molecular weight. According to this, the irradiation with higher-intensity ionizing radiation can be performed, and thus the expansion rate can be more preferably suppressed. A known silane coupling agent can be used as the adhesion improver. The silane coupling agent is not particularly limited, however, for example, a vinyl-based silane coupling agent such as vinyltrichlorosilane, vinyltrimethoxysilane, and vinyltriethoxysilane; a methacryloxy-based silane coupling agent such as 3-methacryloxypropyl trimethoxy silane, 3-methacryloxypropyl diethoxy silane, and 3-methacryloxypropyl triethoxy silane; and the like can be preferably used. Furthermore, these may be used alone or also as a mixture of two or more kinds thereof. Among them, a methacryloxy-based silane coupling agent can be particularly preferably used.

In the case where a silane coupling agent is added as the adhesion improver, the content is 0.1 or more to 10.0 or less parts by mass, and the upper limit is preferably 5.0 parts by mass or less, relative to 100 parts by mass of the total components in the sealing material composition. In the case where the content of the silane coupling agent is in the range described above, and an adequate amount of ethylenic unsaturated silane compound is contained in a polyolefin-base resin that constitutes the sealing material composition, the adhesion is improved to the more preferable range. In addition, in the case where the content exceeds the range, there may be a case where the film formability is decreased, or the silane coupling agent is aggregated and solidified with the lapse of time, and powderized on the surface of the sealing material sheet, that is, so-called bleed-out is generated, and thus this is not preferable.

[Radical Absorbent]

In the present invention, with the use of a cross-linking auxiliary agent that is to be a radical polymerization initiator, and a radical absorbent that quenches the cross-linking auxiliary agent in combination, the degree of the cross-linking is adjusted, and thus the gel fraction can be more finely adjusted. Examples of such a radical absorbent include an antioxidant such as a hindered phenol-based antioxidant, and a light stabilizer such as a hindered amine-based light stabilizer. A hindered phenol-based radical absorbent that has high radical absorption ability in the vicinity of the cross-linking temperature is preferable. The amount used of the radical absorbent is in the range of preferably 0.01 or more to 3 or less parts by mass, and more preferably 0.05 or more to 2.0 or less parts by mass. As long as the amount used is in this range, the cross-linking reaction is appropriately suppressed, and the gel fraction of cross-linked sealing material sheet before the modularization can be 40% or less.

[Other Components]

Other components may also be contained in the sealing material composition. For example, examples of other components include a component such as a weather-resistant master batch, various fillers, a light stabilizer, an ultraviolet absorbent, and a heat stabilizer, which are used for the imparting of weather resistance to the sealing material sheet produced from the sealing material composition of the present invention. Each content of these components is preferably in the range of 0.001 or more to 5 or less parts by mass in the sealing material composition, although being different depending on particle shape, density, and the like. By containing these additives, the sealing material composition can be imparted with mechanical strength that is stable over a long period of time, the protective effect of yellowing, cracking, and the like, etc.

The weather-resistant master batch is obtained by the dispersion of a light stabilizer, an ultraviolet absorbent, a heat stabilizer, the antioxidant described above, and the like into a resin such as polyethylene. By the addition of the weather-resistant master batch into the sealing material composition, favorable weather resistance can be imparted to the sealing material sheet. As the weather-resistant master batch, one that is appropriately prepared may be used, or one that is commercially available may be used. The resin used for the weather-resistant master batch may be the linear low density polyethylene that is used for the present invention, or may be other resins described above.

Furthermore, the light stabilizer, the ultraviolet absorbent, the heat stabilizer, and the antioxidant, which are described above, may be used singly, or in combination of two or more kinds thereof.

In addition, examples of other components used for the sealing material composition of the present invention include a nucleating agent, a dispersant, a leveling agent, a plasticizer, an antifoaming agent, and a fire retardant, other than those described above.

Sealing Material Sheet

The sealing material sheet of the present invention is to be a sealing material sheet for a solar cell module of the present invention in a sheet shape or a film shape by obtaining an uncross-linked sealing material sheet through a sheeting step in which the sealing material composition described above is melt formed at a temperature exceeding the melting point, and then by performing the cross-linking step by irradiation with ionizing radiation. Furthermore, as one example thereof, according to a production method as explained in detail in the following, the sealing material sheet that has extremely preferable heat resistance, transparency, adhesion, and the like is obtained by the limitation of the gel fraction and the weight average molecular weight in terms of polystyrene to the predetermined range. In addition, the sheet shape in the present invention means a sheet shape including a film shape, and both the sheet shape and the film shape are not different from each other.

[Production Method of Sealing Material Sheet]
(Sheeting Step)

The film formation of the sealing material composition described above by melt formation is performed by a forming method that is usually used for an ordinary thermoplastic resin, that is, by each of various forming methods of injection molding, extrusion molding, blow molding, compression molding, rotational molding, and the like. At this time, the lower limit of the forming temperature may be a temperature exceeding the melting point of the sealing material composition, and the upper limit may be a temperature at which the cross-linking does not start during the film formation according to the one-minute half-life temperature of the cross-linking agent to be used, and thus the forming temperature is not particularly limited as long as it is within these ranges. In the production method of the sealing material sheet for a solar cell module of the present invention, as described above, a cross-linking agent having a one-minute half-life temperature higher than that of the conventional cross-linking agent can be used. Therefore, by the setting of the forming temperature to a temperature higher than the conventionally used temperature, the load on the extruder and the like can be decreased, and the productivity of the sealing material sheet can be increased.

In addition, the uncross-linked sealing material sheet after the sheeting step preferably has the number average molecular weight of 80000 g/mol or more to 120000 g/mol or less and the weight average molecular weight of 150000 g/mol or more to 250000 g/mol or less. The sealing material sheet of the present invention, which has a low gel fraction and the predetermined degree of the dispersity, can be obtained by performing a cross-linking treatment by the irradiation with ionizing radiation to the uncross-linked sealing material sheet having such a molecular weight range described above. In addition, the measurement of the average molecular weight in terms of polystyrene can be performed after the dissolution into a solvent such as THF (tetrahydrofuran), according to a conventionally known GPC method.

The thickness of the sealing material sheet is preferably 100 μm or more to 600 μm or less. In the case where the thickness of the sealing material sheet is less than 100 μm, impacts cannot be sufficiently alleviated, and also the insulation property becomes insufficient, therefore, this thickness is not preferable. Furthermore, even in the case where the thickness of the sealing material sheet exceeds 600 μm, an effect higher than that obtained at the thickness of 100 μm or more to 600 μm or less cannot be obtained, therefore, a thickness exceeding 600 μm is wasteful and thus is not preferable.

(Cross-Linking Step)

The cross-linking step performing a cross-linking treatment to the uncross-linked sealing material sheet after the sheeting step described above is performed by a cross-linking treatment by irradiation with ionizing radiation after the sheeting step and before the start of the integration step of a solar cell module in which the sealing material sheet is integrated with other members. The sealing material sheet of the present invention is characterized by the optimization of the gel fraction and weight average molecular weight in terms of polystyrene of the sealing material sheet into the predetermined range by such the cross-linking step. As described above, by performing the cross-linking treatment by irradiation with ionizing radiation, a sealing material sheet having heat resistance, transparency, and adhesion to other members in a solar cell module can be obtained.

As to the gel fraction of the sealing material sheet, the radiation dose of the ionizing radiation and the addition amount of the cross-linking agent are appropriately adjusted so that the gel fraction is 0% or more to 40% or less, preferably 0% or more to 10% or less, and more preferably 0% or more to 1% or less. By the suppression of the gel fraction to 40% or less, the property of wraparound to the unevenness of other members laminated above and below during the modularization is enhanced, and the load during the melt extrusion is decreased, and thus the sealing material sheet can be stably produced with high productivity. Furthermore, by the suppression of the gel fraction to 10% or less, the cracking of particularly a thin-film solar cell element can be prevented. In addition, by the sufficient wetting on the interface of glass adhesion component, the glass adhesion can be improved.

Furthermore, conventionally, when the gel fraction is 1% or less, the effect of the flow suppression by the cross-linking step before the modularization step is not expressed, and thus there has been a problem that the film thickness of the sealing material sheet becomes difficult to be maintained at a constant thickness due to the excessive flowability. However, the sealing material sheet of the present invention avoids such a problem by a cross-linking treatment by irradiation with an electron beam, and by the limitation of the weight average molecular weight and the degree of dispersity to the predetermined range, the sealing material sheet can be preferably used as a sealing material sheet for a solar cell module.

Herein, the gel fraction (%) means a gel fraction obtained as follows: 0.1 g of sealing material sheet is put in a resin mesh, and extracted with toluene at 60° C. for 4 hours, and then the resultant is taken out together with the mesh, and subjected to a drying treatment, subsequently, the resultant is weighed, the mass values of before and after the extraction are compared with each other, and the percent by mass of the residual insoluble matter is measured.

As to the molecular weight distribution of the sealing material sheet, in the optimal range of the number average molecular weight (Mn) and the optimal range of the weight average molecular weight (Mw), which are described below, the cross-linking treatment by irradiation with ionizing radiation is performed so that the degree of dispersity (Mw/Mn), which is the ratio of the weight average molecular weight (Mw) to the number average molecular weight (Mn) in terms of polystyrene, is 2.5 or more to 3.5 or less, the lower limit Is preferably 2.6 or more, more preferably 2.7 or more, and particularly preferably 2.8 or more, and the upper limit is preferably 3.3 or less, and more preferably 3.1 or less. In the case of being used as a solar cell module, when the degree of dispersity is less than 2.5, heat resistance becomes inferior, and thus the degree of dispersity is not preferable, and when the degree of dispersity exceeds 3.5, the cross-linking of a resin proceeds excessively, and the unevenness followability during the production of cells becomes inferior, and thus the degree of dispersity is not preferable. In the sealing material sheet of the present invention, the molecular weight becomes enormous on the weight average molecular weight basis while the low gel fraction is maintained, at this time, the increase of molecular weight is suppressed to relatively extremely small on the number average molecular weight basis. As a result, the sealing material sheet of the present invention is a sealing material sheet in which the degree of dispersity is increased by a cross-linking treatment by irradiation with ionizing radiation. The low density polyethylene-based sealing material having such a specific degree of dispersity cannot be obtained by a conventional thermal cross-linking treatment, but can be obtained by a cross-linking treatment by irradiation with ionizing radiation. This is because according to the cross-linking treatment by irradiation with ionizing radiation, which Is different from the case of the conventional thermal cross-linking treatment, a radiation specific to the cross-linking reaction by irradiation with ionizing radiation proceeds, in which, while the cross-linking proceeds in the sealing material, the decomposition reaction also irregularly simultaneously proceeds. The sealing material sheet of the present invention that has such a specific degree of dispersity is a sealing material sheet that is more excellent in terms of heat resistance, transparency, and adhesion, as compared to a conventional sealing material sheet.

Furthermore, the cross-linking treatment by the irradiation with ionizing radiation is preferably performed so that the difference determined by subtracting the degree of dispersity of the uncross-linked sealing material sheet obtained before the irradiation with ionizing radiation from the degree of dispersity of cross-linked sealing material sheet obtained after the irradiation with ionizing radiation is +0.3 or more to +1.0 or less. Such changes in the degree of dispersion are, that is, resulted from the irradiation with ionizing radiation in which the cross-linking and the decomposition proceed irregularly, and the sealing material sheet of the present invention has preferable properties as described above, by undergoing the specific changes.

As to the absolute value of the molecular weight of the sealing material sheet, the number average molecular weight is preferably 80000 g/mol or more to 120000 g/mol or less, and the weight average molecular weight is preferably 220000 g/mol or more to 300000 g/mol or less in terms of polystyrene. By the setting of the molecular weight to such an enormous molecular weight range while the low gel fraction is maintained as described above, a sealing material sheet having heat resistance, transparency, and adhesion can be obtained.

Herein, the measurement of the molecular weight can be performed after the dissolution into a solvent such as THF, according to a conventionally known GPC method. Furthermore, in the case where a polymer having a molecular weight of Mi (g/mol) is Ni (polymers) in the sealing material sheet, the number average molecular weight Mn, the weight average molecular weight Mw, and the degree of dispersity d are defined by the following equations, respectively.

Number average molecular weight: $Mn=\Sigma(MiNi)/\Sigma Ni$

Weight average molecular weight: $Mw=\Sigma(Mi^2Ni)/\Sigma MiNi$

Dispersity: $d=Mw/Mn$

As to the complex viscosity of the sealing material sheet, the complex viscosity at 150° C. is preferably 85000 Pa·S or more to 180000 Pa·S or less.

By the setting of the complex viscosity of the sealing material sheet to the range described above, the flowability and heat resistance of the sealing material sheet are optimized, and thus by the suppression of the change of the film pressure of the sealing material sheet during the production of a solar cell module, the protrusion of the sealing material sheet outside the module end can be prevented, and the sufficient adhesion and the wraparound property to the unevenness can be provided to the sealing material sheet.

Herein, the complex viscosity (Pa·s) means a complex viscosity measured with the use of a rotating type rheometer (MCR301 manufactured by Anton Paar) under the conditions of parallel plate geometry (8 mm in diameter), 0.5 N stress, 5% distortion, 0.1 (1/s) angular velocity, and a 5° C./min temperature raising rate.

The transparency of the sealing material sheet has a haze value of 4% or less at a thickness of 400 μm. Conventionally, in the case where a cross-linking treatment is performed by ionizing radiation, a cross-linking agent is not required. As described above, in the present invention, there is an excellent point that both the heat resistance and the transparency are achieved by the intentional addition of a cross-linking agent as a composition in the cross-linked sealing material sheet in which a cross-linking treatment by ionizing radiation has been performed. Furthermore, in the present specification, from the viewpoint of showing the characteristics in the actual use environment, the haze value of the sealing material sheet means a haze value obtained by the cooling of a sample of the sealing material sheet in which the resin temperature has been increased up to 150° C., under the condition of −3° C./min.

The cross-linking treatment can be performed by ionizing radiation such as electron beams (EB), α-rays, β-rays, γ-rays, and neutron beams, and among them, electron beams are preferably used. As to the cross-linking treatment by the irradiation with ionizing radiation, as the total treatment results, as long as the gel fraction and degree of dispersity described above are in the predetermined range explained in the above, each cross-linking condition is not particularly limited, however, as one example thereof, the sealing material sheet of the present invention can be produced in a preferable embodiment by the performing of the cross-linking treatment by irradiation with ionizing radiation in the ranges of the following conditions (a) and (b) of the radiation dose and the voltage.

(a) Radiation dose: 2 kGy or more to 100 kGy or less
(b) Voltage: in a sealing material sheet having a thickness of t, a voltage at which the dose of the radiation passed through the portion to be the distance ½t from the irradiated surface inside the sealing material sheet is 30% or more to 70% or less relative to the radiation dose on the irradiated surface, and the reached dose of the radiation on the rear surface of the opposite side to the irradiated surface is 0% or more to 25% or less relative to the radiation dose on the irradiated surface.

In addition, the cross-linking treatment may be performed in-line continuously subsequent to the sheeting step, or may be performed off-line. Furthermore, in the case where the cross-linking treatment is a general cross-linking treatment, generally the content of the cross-linking agent is required in an amount of 0.5 part by mass or more to 1.5 parts by mass or less relative to 100 parts by mass of the total components in the sealing material sheet, however, in the sealing material sheet of the invention of the present application, when the content of the cross-linking agent is 0.02 part by mass or more, sufficient heat resistance can be obtained even if the content is less than 0.5 part by mass.

Solar Cell Module

FIG. 1 is a sectional view showing one example of the layer structures in a solar cell module using a sealing material sheet of the present invention. A solar cell module 1 of the present invention is laminated sequentially from the photoreception surface side of incident light with a transparent front substrate 2, a front surface sealing material layer 3, a solar cell element 4, a rear surface sealing material layer 5, and a rear surface protective sheet 6 in this order. The sealing material sheet described above is used for at least one of the front surface sealing material layer 3 and the rear surface sealing material layer 5 in the solar cell module 1 of the present invention.

[Production Method of Solar Cell Module]

A solar cell module 1 can be produced, for example, by the integration of a member made of the sequential lamination of the above-mentioned transparent front substrate 2, front surface sealing material layer 3, solar cell element 4, rear surface sealing material layer 5, and rear surface protective sheet 6 in this order, by vacuum suction and the like, and then according to a forming method such as a lamination method, by the heat and pressure forming of the member described above as an integrally formed body.

In addition, in the solar cell module 1 of the present invention, a conventionally known material can be used without any particular limitation for the transparent front substrate 2, the solar cell element 4, and the rear surface protective sheet 6, which are members other than the front surface sealing material layer 3 and the rear surface sealing material layer 5. Furthermore, the solar cell module 1 of the present invention may contain a member other than the members described above. In addition, the sealing material sheet of the present invention can be applied not only for a monocrystalline type solar cell module, but also for a thin film type and all the other solar cell modules.

EXAMPLES

Hereinafter, the present invention will be explained more specifically by way of Examples, however, the present invention should not be construed to be limited to the following Examples.

Production of Sealing Material Sheet for Solar Cell Module

As described below, an uncross-linked sealing material sheet 1 or 2 was formed from the sealing material composition in which a low density polyethylene resin is contained as the main resin, the sealing material sheet 1 was used as a sealing material sheet in Comparative Example. Furthermore, as described below, the cross-linking treatment by the irradiation with ionizing radiation was performed for the uncross-linked sealing material sheet 1 or 2 described above under a different cross-linking condition, and each cross-linked sealing material sheet was formed and used as a sealing material sheet in Example 1 or 2.

(Sealing Material Sheet 1)

An uncross-linked sealing material sheet 1 was formed with the use of the sealing material composition that was formulated as in the following.

Silane-modified transparent resin: 2 parts by mass of vinyltrimethoxysilane, and 0.1 part by mass of dicumyl peroxide as a radical generating agent (reaction catalyst) were mixed into 98 parts by mass of the metallocene-based linear low density polyethylene (M-LLDPE) in which the density was 0.881 g/cm$^3$, and the MFR at 190° C. was 2 g/10 min, and the mixture was melted at 200° C., and kneaded, as a result, a silane-modified transparent resin (hereinafter, referred to as "resin S") in which the density was 0.884 g/cm$^3$, and the MFR at 190° C. was 1.8 g/10 min was obtained. In addition, the metallocene-based linear low density polyethylene described above had the number average molecular weight (Mn) of 32000 g/mol and the weight average molecular weight (Mw) of 72000 g/mol in terms of polystyrene, and the degree of dispersity (Mw/Mn) of 2.3 on the raw material basis.

Weather-resistant master batch: 3.8 parts by mass of benzophenol-based ultraviolet absorbent, 5 parts by mass of hindered amine-based light stabilizer, and 0.5 part by mass of phosphorus-based thermal stabilizer were mixed into 100 parts by mass of the powder that had been obtained by the crushing of the Ziegler linear low density polyethylene having a density of 0.880 g/cm$^3$, the mixture was melted and processed, and thus a pelletized master batch was obtained.

Cross-linking agent compound resin: 0.1 part by mass of 2,5-dimethyl-2,5-di(t-butyl peroxy)hexane was impregnated into 100 parts by mass of the M-LLDPE pellet in which the density was 0.880 g/cm$^3$, and the MFR at 190° C. was 3.1 g/10 min, and thus compound pellets were obtained.

A composition obtained by the mixing of 20 parts by mass of resin S, 5 parts by mass of weather-resistant master batch 2, and 80 parts by mass of cross-linking agent compound resin was formed into a sealing material sheet 1 having a thickness of 400 μm at an extrusion temperature of 210° C. and a taking-up speed of 1.1 m/min with the use of a ϕ30 mm extruder, and a film forming machine having a T-die with a width of 200 mm, and this was used for Comparative Example.

Example 1 a cross-linked sealing material sheet was obtained by the irradiation with an electron beam to both surfaces of the sealing material sheet in Comparative Example at an acceleration voltage of 200 kV and a radiation dose of 20 kGy, and 40 kGy in total with the use of an electron beam irradiator (product name: EC250/15/180L, manufactured by IWASAKI ELECTRIC Co., Ltd.), and this was used for Example 1.

(Sealing Material Sheet 2)

An uncross-linked sealing material sheet 2 was formed with the use of the sealing material composition, which was formulated as in the following.

Weather-resistant master batch: into 100 parts by mass of the powder that had been obtained by the crushing of the Ziegler linear low density polyethylene having a density of 0.880 g/cm³, 3.8 parts by mass of benzophenol-based ultraviolet absorbent, 5 parts by mass of hindered amine-based light stabilizer, and 0.5 part by mass of phosphorus-based thermal stabilizer were mixed, the mixture was melted and processed, and thus a pelletized master batch was obtained. With the use of 99.6 parts by mass of the metallocene-based linear low density polyethylene (M-LLDPE) in which the density was 0.881 g/cm³, and the MFR at 190° C. was 2 g/10 min, 0.4 part by mass of vinyltrimethoxysilane, 0.02 part by mass of dicumyl peroxide as a radical generating agent (reaction catalyst), 5 parts by mass of weather-resistant master batch 2, a ϕ30 mm extruder, and a film forming machine having a T-die with a width of 200 mm, the formation was performed at an extrusion temperature of 210° C. and a taking-up speed of 1.1 m/min, and thus a sealing material sheet 2 having a thickness of 400 μm was obtained.

Example 2 a cross-linked sealing material sheet was obtained by the irradiation with an electron beam to both surfaces of the sealing material sheet 2 at an acceleration voltage of 200 kV and a radiation dose of 30 kGy, and 60 kGy in total with the use of an electron beam irradiator (product name: EC2/250/15L, manufactured by IWASAKI ELECTRIC Co., Ltd.), and this was used for Example 2.

Figure 2:
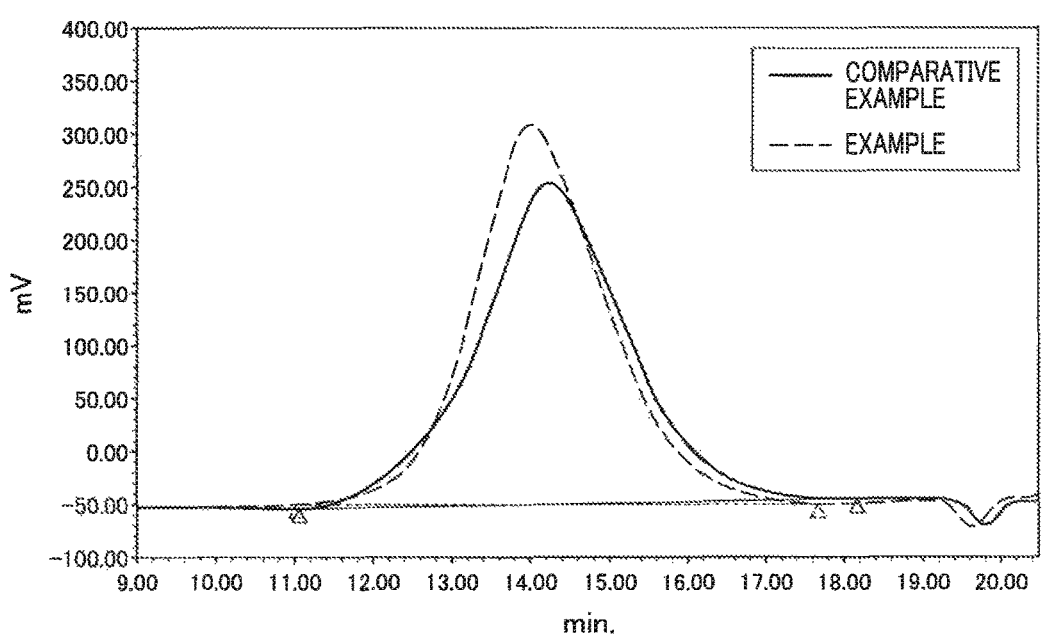
FIG. 2 is a graph illustrating the molecular weight distribution by GPC in Examples.

The gel fraction, molecular weight, and molecular weight distribution of each sealing material sheet in the Examples 1 and 2, and Comparative Example described above were measured by the following method. The measurement results and the degree of dispersity calculated from the measurement results are shown in Table 1 and FIG. 2. Furthermore, FIG. 2 is a graph illustrating each molecular weight distribution by GPC in Example 1 and Comparative Example.

Gel fraction (%): 0.1 g of each sealing material sheet in Example and Comparative Example was put in a resin mesh, and extracted with toluene at 60° C. for 4 hours, and then the resultant was taken out together with the mesh, and subjected to a drying treatment, subsequently, the resultant was weighed, the weight values before and after the extraction were compared with each other, the percent by mass of the residual insoluble matter was measured, and thus this was used as the gel fraction.

Molecular weight: each sealing material sheet in Example and Comparative Example was dissolved in o-dichlorobenzene, and the number average molecular weight, the weight average molecular weight, and the molecular weight distribution in terms of polystyrene of each sealing material sheet were measured under the following conditions.

Measurement model: GPC/V2000 manufactured by Wataers,
Column: Shodex AT-G+AT-806MS×2
Eluent: o-dichlorobenzene (containing 0.3% BHT)
Temperature: column and injector at 145° C.
Concentration: around 1.0 g/L
Flow rate: 1.0 mL/min
Solubility: complete dissolution
Detector: refractive index detector (RI)

TABLE 1

| | Cross-linking condition | | Gel fraction (%) | Molecular weight | | |
|---|---|---|---|---|---|---|
| | Radiation dose(E) (kGy) | Voltage (kV) | | Number average molecular weight | Weight average molecular weight (g/mol) | Dispersity |
| Example 1 | 40 | 200 | 0 | 101000 | 293000 | 2.9 |
| Example 2 | 60 | 200 | 8 | 115000 | 295000 | 2.6 |
| Comparative Example | — | — | 0 | 97300 | 218000 | 2.2 |

Evaluated Examples

As to each sealing material sheet in Example and Comparative Example, the glass adhesion strength, the haze value (JIS K7136), the vertical slide test at 150° C., the total light transmittance, and the thermal shrinkage were measured. The results are shown in Table 2. Furthermore, each of the test conditions was as in the following.

Glass adhesion strength: each sealing material sheet in Example and Comparative Example that had been cut to a width of 15 mm was brought into close contact on each glass substrate (white plate float semi-tempered glass JPT3.2 75 mm×50 mm×3.2 mm), the resultant was subjected to a treatment at 150° C. for 18 minutes with a vacuum heating laminator, and thus each sample for evaluation of solar cell module was obtained in each Example and Comparative Example. A sealing material sheet being in close contact on the glass substrate was subjected to a vertical peel (50 mm/min) test with a peel testing machine (TENSILON universal testing machine RTF-1150-H), and thus the glass adhesion strength was measured.

Thermal shrinkage (%): a test piece of 100 mm×100 mm of sealing material sheet in the sealing material sheet was placed on a talc plate heated to 150° C., and left to stand for 10 minutes, and then the thermal shrinkage (%) that is the shrinkage ratio of the side length of the test piece in the MD direction before and after the heating was measured. Furthermore, the MD direction means a longitudinal direction being the discharge direction in the sheeting step.

Heat resistant creep (mm): two sheets of the sealing material cut into 5×7.5 cm were superposed onto a large-sized glass plate on which surface texturing had been performed, and onto which a textured glass of 5×7.5 cm was also superposed, and then the resultant was subjected to a cross-linking treatment. After that, the large-sized glass plate was placed vertically, and left at 150° C. for 12 hours. The moving distance of the textured glass of 5×7.5 cm after the glass had been left was measured and evaluated.

Haze (%): in accordance with JISK7136, the haze was measured with Haze-Transmittance device type HM150 by Murakami Color Research Laboratory Co., Ltd. The value obtained by the cooling of the sealing material sheet in which the resin temperature had been increased up to 150° C., under the condition of −3° C./min was used as the haze value.

Total light transmittance (%): in accordance with JISK7361, the total light transmittance was measured with Haze-Transmittance device type HM150 by Murakami Color Research Laboratory Co., Ltd.

TABLE 2

| | Heat resistance | | Transparency | |
|---|---|---|---|---|
| | Glass adhesion (N/15 mm) | Thermal shrinkage (%) | Heat resistant creep (mm) | Haze (%) | Total light transmittance (%) |
| Example 1 | 30.0 | 37.0 | 0.2 | 3.2 | 88.4 |
| Example 2 | 27.0 | 5.0 | 0.1 | 3.1 | 88.2 |
| Comparative Example | 37.2 | 58.9 | 17.2 | 4.3 | 87.8 |

From Tables 1 and 2, it has been found that according to the cross-linking treatment by irradiation with ionizing radiation, the sealing material sheet of the present invention in which the gel fraction and the molecular weight distribution are limited to the specific range is a sealing material sheet excellent in terms of adhesion, heat resistance, and transparency.

The invention claimed is:

1. A sealing material sheet for a solar cell module, comprising a low density polyethylene having a density of 0.900 g/cm³ or less in an amount of 90 parts by mass or more relative to 100 parts by mass of total resin components in the sealing material composition, wherein
    a gel fraction is 0% or more to 10% or less, and
    a degree of dispersity (Mw/Mn) being a ratio of weight average molecular weight (Mw) to number average molecular weight (Mn) in terms of polystyrene is 2.5 or more to 3.5 or less.

2. The sealing material sheet for a solar cell module according to claim 1, wherein the number average molecular weight is 80000 g/mol or more to 120000 g/mol or less, and
    the weight average molecular weight is 220000 g/mol or more to 300000 g/mol or less.

3. The sealing material sheet for a solar cell module according to claim 1, wherein the gel fraction is 0% or more to less than 10%.

4. The sealing material sheet for a solar cell module according to claim 1, wherein the gel fraction is 0% or more to less than 1%.

5. The sealing material sheet for a solar cell module according to claim 1, wherein a complex viscosity at 150° C. is 85000 Pa·S or more to 180000 Pa·S or less.

6. The sealing material sheet for a solar cell module according to claim 1, wherein a haze value at a thickness of 400 μm is 4% or less.

7. A solar cell module, comprising the sealing material sheet according to claim 1.

8. A method for producing a sealing material sheet for a solar cell module, wherein
    a gel fraction of the sealing material sheet is 0% or more to 40% or less, and
    a degree of dispersity (Mw/Mn) being a ratio of weight average molecular weight (Mw) to number average molecular weight (Mn) in terms of polystyrene of the sealing material sheet is 2.5 or more to 3.5 or less, and
    wherein a sealing material composition containing a low density polyethylene having a density of 0.900 g/cm³ or less, and a cross-linking agent in an amount of 0.01 percent by mass or more to less than 0.5 percent by mass in the composition is melt formed, and then irradiation with ionizing radiation onto the sealing material composition is performed.

9. The method for producing the sealing material sheet for a solar cell module according to claim 8, wherein a difference determined by subtracting a degree of dispersity obtained before the irradiation with ionizing radiation from a degree of dispersity obtained after the irradiation with ionizing radiation is +0.3 or more to +1.0 or less.

10. The method for producing the sealing material sheet for a solar cell module according to claim 9, wherein the number average molecular weight before the irradiation with ionizing radiation is 80000 g/mol or more to 120000 g/mol or less, and
    the weight average molecular weight before the irradiation with ionizing radiation is 150000 g/mol or more to 250000 g/mol or less.

11. The sealing material sheet for a solar cell module according to claim 2, wherein the gel fraction is 0% or more to less than 10%.

12. The sealing material sheet for a solar cell module according to claim 2, wherein the gel fraction is 0% or more to less than 1%.

13. The sealing material sheet for a solar cell module according to claim 2, wherein a complex viscosity at 150° C. is 85000 Pa·S or more to 180000 Pa·S or less.

14. The sealing material sheet for a solar cell module according to claim 3, wherein a complex viscosity at 150° C. is 85000 Pa·S or more to 180000 Pa·S or less.

15. The sealing material sheet for a solar cell module according to claim 4, wherein a complex viscosity at 150° C. is 85000 Pa·S or more to 180000 Pa·S or less.

16. The sealing material sheet for a solar cell module according to claim 2, wherein a haze value at a thickness of 400 μm is 4% or less.

17. The sealing material sheet for a solar cell module according to claim 1, wherein the gel fraction is 0%.

18. The sealing material sheet for a solar cell module according to claim 2, wherein the gel fraction is 0%.

19. The sealing material sheet for a solar cell module according to claim 17, wherein a complex viscosity at 150° C. is 85000 Pa·S or more to 180000 Pa·S or less.

20. The sealing material sheet for a solar cell module according to claim 18, wherein a complex viscosity at 150° C. is 85000 Pa·S or more to 180000 Pa·S or less.

* * * * *